(12) United States Patent
Nagy et al.

(10) Patent No.: US 7,135,720 B2
(45) Date of Patent: Nov. 14, 2006

(54) GALLIUM NITRIDE MATERIAL TRANSISTORS AND METHODS ASSOCIATED WITH THE SAME

(75) Inventors: Walter H. Nagy, Raleigh, NC (US); Ricardo M. Borges, Morrisville, NC (US); Jeffrey D. Brown, Charlotte, NC (US); Apurva D. Chaudhari, Raleigh, NC (US); James W. Cook, Jr., Raleigh, NC (US); Allen W. Hanson, Cary, NC (US); Jerry W. Johnson, Raleigh, NC (US); Kevin J. Linthicum, Cary, NC (US); Edwin L. Piner, Cary, NC (US); Pradeep Rajagopal, Raleigh, NC (US); John C. Roberts, Hillsborough, NC (US); Sameer Singhal, Apex, NC (US); Robert J. Therrien, Apex, NC (US); Andrei Vescan, Herzogenrath (DE)

(73) Assignee: Nitronex Corporation, Raleigh, NC (US)

( * ) Notice: Subject to any disclaimer, the term of this patent is extended or adjusted under 35 U.S.C. 154(b) by 119 days.

(21) Appl. No.: 10/913,297

(22) Filed: Aug. 5, 2004

(65) Prior Publication Data

US 2005/0167775 A1 Aug. 4, 2005

Related U.S. Application Data

(60) Provisional application No. 60/493,039, filed on Aug. 5, 2003.

(51) Int. Cl.
*H01L 31/072* (2006.01)
(52) U.S. Cl. ........................... 257/192; 257/194
(58) Field of Classification Search ............ 257/192, 257/194, 615
See application file for complete search history.

(56) References Cited

U.S. PATENT DOCUMENTS 4,843,440 A 6/1989 Huang
5,192,987 A 3/1993 Khan et al.
5,239,188 A 8/1993 Takeuchi et al.

(Continued)

FOREIGN PATENT DOCUMENTS

WO    WO 96/41906    12/1996

(Continued)

OTHER PUBLICATIONS

Ando, Y. et al., "10-W/mm AlGaN-GaN HFET With a Field Modulating Plate," IEEE Electron Device Lett. 24(5):289 (2003), May 2003.

(Continued)

*Primary Examiner*—Mark V. Prenty
(74) *Attorney, Agent, or Firm*—Wolf, Greenfield & Sacks, P.C.

(57) ABSTRACT

Gallium nitride material transistors and methods associated with the same are provided. The transistors may be used in power applications by amplifying an input signal to produce an output signal having increased power. The transistors may be designed to transmit the majority of the output signal within a specific transmission channel (defined in terms of frequency), while minimizing transmission in adjacent channels. This ability gives the transistors excellent linearity which results in high signal quality and limits errors in transmitted data. The transistors may be designed to achieve low ACPR values (a measure of excellent linearity), while still operating at high drain efficiencies and/or high output powers. Such properties enable the transistors to be used in RF power applications including third generation (3G) power applications based on W-CDMA modulation.

81 Claims, 11 Drawing Sheets

U.S. PATENT DOCUMENTS

| | | | |
|---|---|---|---|
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,739,554 A | 4/1998 | Edmond et al. | |
| 5,741,724 A | 4/1998 | Ramandi et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |
| 5,874,747 A | 2/1999 | Redwing et al. | |
| 5,929,467 A | 7/1999 | Kawai et al. | |
| 6,051,849 A | 4/2000 | Davis et al. | |
| 6,064,078 A | 5/2000 | Northrup et al. | |
| 6,064,082 A | 5/2000 | Kawai et al. | |
| 6,069,021 A | 5/2000 | Terashima et al. | |
| 6,100,545 A | 8/2000 | Chiyo et al. | |
| 6,120,600 A | 9/2000 | Edmond et al. | |
| 6,121,121 A | 9/2000 | Koide | |
| 6,139,628 A | 10/2000 | Yuri et al. | |
| 6,146,457 A | 11/2000 | Solomon | |
| 6,153,010 A | 11/2000 | Kiyoku et al. | |
| 6,156,581 A | 12/2000 | Vaudo et al. | |
| 6,177,688 B1 | 1/2001 | Linthicum et al. | |
| 6,180,270 B1 | 1/2001 | Cole et al. | |
| 6,201,262 B1 | 3/2001 | Edmond et al. | |
| 6,255,198 B1 | 7/2001 | Linthicum et al. | |
| 6,261,929 B1 | 7/2001 | Gehrke et al. | |
| 6,261,931 B1 | 7/2001 | Keller et al. | |
| 6,265,289 B1 | 7/2001 | Zheleva et al. | |
| 6,291,319 B1 | 9/2001 | Yu et al. | |
| 6,329,063 B1 | 12/2001 | Lo et al. | |
| 6,380,108 B1 | 4/2002 | Linthicum et al. | |
| 6,391,748 B1 | 5/2002 | Temkin et al. | |
| 6,403,451 B1 | 6/2002 | Linthicum et al. | |
| 6,420,197 B1 | 7/2002 | Ishida et al. | |
| 6,426,512 B1 | 7/2002 | Ito et al. | |
| 6,440,823 B1 | 8/2002 | Vaudo et al. | |
| 6,441,393 B1 | 8/2002 | Goetz et al. | |
| 6,459,712 B1 | 10/2002 | Tanaka et al. | |
| 6,465,814 B1 | 10/2002 | Kasahara et al. | |
| 6,486,502 B1 | 11/2002 | Sheppard et al. | |
| 6,498,111 B1 | 12/2002 | Kapolnek et al. | |
| 6,521,514 B1 | 2/2003 | Gehrke et al. | |
| 6,524,932 B1 | 2/2003 | Zhang et al. | |
| 6,548,333 B1 | 4/2003 | Smith | |
| 6,583,034 B1 | 6/2003 | Ramdani et al. | |
| 6,583,454 B1 | 6/2003 | Sheppard et al. | |
| 6,586,781 B1 | 7/2003 | Wu et al. | |
| 6,610,144 B1 | 8/2003 | Mishra et al. | |
| 6,611,002 B1 | 8/2003 | Weeks et al. | |
| 6,617,060 B1 | 9/2003 | Weeks et al. | |
| 6,624,452 B1 | 9/2003 | Yu et al. | |
| 6,649,287 B1 | 11/2003 | Weeks, Jr. et al. | |
| 6,765,240 B1 | 7/2004 | Tischler et al. | |
| 6,765,241 B1 | 7/2004 | Ohno et al. | |
| 6,777,278 B1 | 8/2004 | Smith | |
| 6,841,409 B1 | 1/2005 | Onishi | |
| 6,849,882 B1 | 2/2005 | Chavarkar et al. | |
| 2001/0042503 A1 | 11/2001 | Lo et al. | |
| 2002/0020341 A1 | 2/2002 | Marchand et al. | |
| 2002/0117695 A1 | 8/2002 | Borges | |
| 2003/0136333 A1 | 7/2003 | Semond et al. | |
| 2005/0167775 A1* | 8/2005 | Nagy et al. | 257/500 |

FOREIGN PATENT DOCUMENTS

| | | |
|---|---|---|
| WO | WO 99/01931 | 1/1999 |
| WO | WO 01/13436 A1 | 2/2001 |
| WO | WO 02/048434 A3 | 6/2002 |
| WO | WO 03/007338 A2 | 1/2003 |
| WO | WO 03/007383 A3 | 1/2003 |

OTHER PUBLICATIONS

Ando, Y. et al., "A 110-W AlGaN/GaN Heterojunction FET On Thinned Sapphire Substrate," Photonic and Wireless Devices Research Labs, NEC Corp. (2001).

Binari, S.C. et al., "Microwave Performance of GaN MESFETs" Electronics Lett. 30(15):1248 (1994), Jul. 1994.

Bindra, A., "Exotic Materials Squeeze More Juice Out of RF Power Amplifiers," www.elecdesign.com, ED Online ID #2367, Jun. 24, 2002.

Borges, R. et al., "GaN HFETs on Silicon Target Wireless Infrastructure Market," Compound Semiconductor, p. 2 (Aug. 2003).

Brown, J.D. et al., "AlGaN/GaN HFETs Fabricated on 100-mm GaN on Silicon (111) Substrates," Solid-State Electronics 46:1535 (2002).

Brown, J.D. et al., "Performance of AlGaN/GaN HFETs Fabricated on 100mm Silicon Substrates for Wireless Basestation Applications," Nitronex Corporation, IEEE MTT-S Digest p. 833 (2004).

Chen, P. et al., "Growth of High Quality GaN Layers With AlN Buffer on Si(111) Substrates," J. Crystal Growth 225:150 (2001).

Chumbes, E. et al., "AlGaN/GaN high Electron Mobility Transistors on Si(III) Substrates," IEEE Trans. Electron Dev. 48(3):420 (2001), Mar. 2001.

Dadgar, A. et al., "Bright, Crack-Free InGaN/GaN Light Emitters on Si(III)," Phys. Stat. Sol. 192(2):308 (2002).

Dadgar, A. et al., "Metalorganic Chemical Vapor Phase Epitaxy of Crack-Free GaN on Si (III) Exceeding 1 μm in Thickness," Jpn. J. Appl. Phys. 39:L1183 (2000), Nov. 2000.

Dadgar, A. et al., "MOVPE Growth of GaN on Si(III) Substates," J. Crystal Growth 248:556 (2003).

Elhamri, S. et al., "An Electrical Characterization of a Two Dimensional Electron Gas in GaN/AlGaN on Silicon Substrates," J. Appl. Phys. 95(12):7982 (2004).

Fanning, D. et al., "Dielectrically Defined Optical T-Gate for High Power GaAs pHEMTs," GaAsMANTECH Conference (2002).

Guha, S. et al., "Ultraviolet and Violet GaN Light Emitting Diodes on Silicon," Appl. Phys. Lett. 72(4):415 (1998), Jan. 1998.

Hageman, P.R. et al., "High Quality GaN Layers on Si(III) Substrates: AlN Buffer Layer Optimisation and Insertion of a SiN Intermediate Layer," Phys. Stat. Sol. 188(2):523 (2001).

Hanington, G. et al., "P/He Ion Implant Isolation Technology for AlGaN/GaN HFETs," Electronics Lett. 34(2):193 (1998), Jan. 1998.

Hanson, A.W. et al., "Development of a GaN Transistor Process for Linear Power Applications," Nitronex Corporation, Paper presented at the 2004 International Conference on Compound Semiconductor Manufacturing Technology (GaAs MANTECH), Miami, FL.

Hirosawa, K. et al., "Growth of Single Crystal $Al_2Ga_{1-\alpha}N$ Films on Si Substrates by Metalorganic Vapor Phase Epitaxy," Jpn. J. Appl. Phys. 32:L1039 (1993), Aug. 1993.

International Search Report, from corresponding International Application No. PCT/US2004/025433, mailed Mar. 30, 2005.

Ishikawa, H. et al., "High-Quality GaN on Si Substrate Using AlGaN/AlN Intermediate Layer," Phys. Stat. Sol. 176:599 (1999).

Johnson, J.W. et al., "12 W/mm AlGaN-GaN HFETs on Silicon Substrates," IEEE Electron Device Lett. 25(7):459 (2004), Jul. 2004.

Johnson, J.W. et al., "$Gd_2O_3$/GaN Metal-Oxide-Semiconductor Field-Effect Transistor," Appl. Phys. Lett. 77(20):3230 (2000), Nov. 2000.

Johnson, J.W. et al., "Material, Process, and Device Development of GaN-Based HFETs on Silicon Substrates," Nitronex Corporation, Electrochemical Society Proceedings 2004-06, 405 (2004).

Joshin, K. et al., "A 174 W High-Efficiency GaN HEMT Power Amplifier for W-CDMA Base Station Applications," Fujitsu Laboratories Ltd. (2003).

Kang, B.S. et al., "Pressure-Induced Changes in the Conductivity of AlGaN/GaN High-Electron Mobility-Transistor Membranes," Appl. Phys. Lett. 85(14):2962 (2004).

Kikkawa, T. et al., "An Over 200-W Output Power GaN HEMT Push-Pull Amplifier with High Reliability," IEEE MTT-S Digest (2004).

Lahreche, H. et al., "Optimisation of AlN and GaN Growth by Metalorganic Vapour-Phase Epitaxy (MOVPE) on Si(III)," J. Crystal Growth 217:13 (2000).

Lee, I. et al., "Growth and Optical Properties of GaN on Si(III) Substrates," J. Crystal Growth 235:73 (2002).

Lei, T. et al., "Epitaxial Growth of Zinc Blende and Wurtzitic Gallium Nitride Thin Films on (001) Silicon," Appl. Phys. Lett. 59(8):944 (1991), Aug. 1991.

Liu, R. et al., "Atomic Arrangement at the AlN/Si (III) Interface," Appl. Phys. Lett. 83(5):860 (2003), Aug. 2003.

Moser, N.A. et al., "Effects of Surface Treatments on Isolation Currents in AlGaN/GaN High-Electron-Mobility Transistors," Appl. Phys. Lett. 83(20):4178 (2003), Nov. 2003.

Nagy, W. et al., "Linearity Characteristics of Microwave Power GaN HEMTs," IEEE Transactions on Microwave Theory & Techniques 51(2):1 (2003), Feb. 2003.

Nakada, Y. et al., "GaN Heteroepitaxial Growth on Silicon Nitride Buffer Layers Formed on Si (III) Surfaces by Plasma-Assisted Molecular Beam Epitaxy," Appl. Phys. Lett. 73(6):827 (1998).

Newey, J., "GaN: Ready for Cellular 3G?," Compound Semiconductor, p. 21 (Jan./Feb. 2004).

Nikishin, S.A. et al., "High Quality GaN Grown on Si(III) by Gas Source Molecular Beam Epitaxy with Ammonia," Appl. Phys. Lett. 75(14):2073 (1999), Oct. 1999.

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al., "Microstructure and Photoluminescence of GaN Grown on Si(III) by Plasma-Assisted Molecular Beam Epitaxy," Appl. Phys. Lett. 65(1):61 (1994), Jul. 1994.

Okamoto, Y. et al., "An 80W AlGaN/GaN Heterojunction FET With a Field-Modulating Plate," IEEE MTT-S Digest p. 225 (2003).

Osinsky, A. et al., "Visible-Blind GaN Schottky Barrier Detectors Grown on Si(III)," Appl. Phys. Lett. 73(5):551 (1998), Feb. 1998.

Palmour, J.W. et al., "Wide Bandgap Semiconductor Devices and MMICs for RF Power Applications," IEEE (2001).

Patel, S., "The Bottleneck on the Road to 3G," WirelessFuture Magazine (Jan./Feb. 2003).

Piner, E., "GaN Transistors and Power Amplifiers Close in on Commercialization," Compound Semiconductor (Jul. 2004).

Rajagopal, P. et al., "Large-Area, Device Quality GaN on Si Using a Novel Transition Layer Scheme," Nitronex Corporation, Material Research Society Symposium Proceedings 743(3) (2003).

Rajagopal, P. et al., "MOCVD AlGaN/GaN HFETs on Si: Challenges and Issues," Symposium Y: GAN and Related Alloys, Nitronex Corporation, Material Research Society Symposium Proceedings, 798, 61-66 (2004).

Reitmeier, Z. et al., "Growth and Characterization of AlN and GaN Thin Films Deposited on Si(III) Substrates Containing a Very Thin Al Layer," Dept. Materials Science & Engineering, NC State University.

Semond, F. et al., "GaN Grown on Si(III) Substrate: From Two-Dimensional Growth to Quantum Well Assessment," Appl. Phys. Lett. 75(1):82 (1999), Jul. 1999.

Seon, M. et al., "Selective Growth of High Quality GaN on Si(III) Substrates," Appl. Phys. Lett. 76(14):1842 (2000), Apr. 2000.

Shealey, J.R., "Progress in Si-Based AlGaN HEMTs for RF Power Amplifiers," Silicon Monolithic Integrated Circuits in RF Systems, Digest of Papers, 2001, Topical Meeting Sep. 12-14, 2001, Piscataway, NJ, USA, pp. 166-169.

Singhal, S. et al., "Gallium Nitride on Silicon HEMTs for Wireless Infrastructure Applications, Thermal Design and Performance," Nitronex Corporation, Paper presented at the European Microwave Week, Mmilan, Italy (2002).

Tanaka, S. et al., "Defect Structure in Selective Area Growth GaN Pyramid on (III)Si Substrate," Appl. Phys. Lett. 76(19):2701 (2000), May 2000.

Thompson, R. et al., "Improved Fabrication Process for Obtaining High Power Density AlGaN/GaN HEMTs," IEEE GaAs Digest p. 298 (2003).

Vescan, A. et5 al., "AlGaN/GaN HFETs on 100 mm Silicon Substrates for Commercial Wireless Applications " Phys. Stat. Sol. (c) 0(I):52 (2002).

Zhao, Z.M. et al., "Metal-Semiconductor-Metal GaN Ultraviolet Photodetectors on Si(III)," Appl. Phys. Lett. 77(3):444 (2000), Jul. 2000.

* cited by examiner

Drain efficiency (solid) and ACPR (open) plotted against output for a drain voltage of 28V and quiescent currents in the 250-450mA range.

Power sweep at a drain voltage of 28V showing 30W of saturated output power, 10dB gain and 43% peak drain efficiency.

GALLIUM NITRIDE MATERIAL TRANSISTORS AND METHODS ASSOCIATED WITH THE SAME

RELATED APPLICATIONS

This application claims priority to U.S. Provisional Patent Application Ser. No. 60/493,039, entitled "Gallium Nitride Transistor Structures and Methods", filed Aug. 5, 2003, which is incorporated herein by reference.

FIELD OF INVENTION

The invention relates generally to gallium nitride material devices and, more particularly, to gallium nitride material transistors and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, and the ability to transmit signals at high frequency, amongst others. Accordingly, gallium nitride materials are being investigated in many microelectronic applications such as transistors and optoelectronic devices.

Despite the attractive properties noted above, a number of challenges exist in connection with developing gallium nitride material-based devices. For example, it may be difficult to grow high quality gallium nitride materials on certain substrates, particularly silicon, due to property differences (e.g., lattice constant and thermal expansion coefficient) between the gallium nitride material and the substrate material. Also, it is has been challenging to form gallium nitride material devices meeting the property requirements for certain applications.

Applications for RF power transistors may have particularly demanding property requirements. For example, RF power transistors used in wireless communications (e.g., in wireless basestation applications) may need to meet property requirements related to output power, linearity, gain and efficiency. Emerging third generation (3G) wireless communications standards, such as W-CDMA, use variable amplitude envelope modulation which places even stricter constraints on linearity compared to the second generation standards. To achieve the required linearity to meet 3G standards, certain transistors (e.g., silicon or gallium arsenide-based transistors) used in second generation applications may need to operate at lower efficiencies and/or power levels which may be insufficient for 3G applications.

SUMMARY OF INVENTION

Gallium nitride material transistors and methods associated with the same are provided.

In one aspect, a device adapted to receive an input signal and to transmit an output signal is provided. The device comprises at least one transistor structure to receive the input signal. The at least one transistor includes at least one active region formed in a gallium nitride material region. The at least one transistor structure being adapted to amplify the input signal to form the output signal. The output signal, when transmitted, has an adjacent channel power ratio (ACPR) of less than or equal to −20 dBc.

In another aspect, a method of generating an output signal for wireless transmission is provided. The method comprising receiving an input signal comprising information to be transmitted; and, amplifying the input signal via at least one transistor structure having at least one active region formed in a gallium nitride material region to provide the output signal. The method further comprises transmitting the output signal such that the output signal has an ACPR of less than or equal to −20 dBc.

In another aspect, a device for generating a radio frequency (RF) output signal from an RF input signal is provided. The device comprises at least one transistor having at least one active region formed in a gallium nitride material layer. The at least one transistor arranged to receive the RF input signal and, when present, amplify the RF input signal to provide the RF output signal. The device comprises at least one matching circuit adapted to transform at least one impedance of the device such that, when the device is loaded with a load, the RF output signal is capable of being transmitted with an ACPR of less than or equal to −20 dBc.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides gallium nitride material transistors and methods associated with the same. The transistors may be used in power applications by amplifying an input signal to produce an output signal having increased power. The transistors may be designed to transmit the majority of the output signal within a specific transmission channel (defined in terms of frequency), while minimizing transmission in adjacent channels. This ability gives the transistors excellent linearity which results in high signal quality and limits errors in transmitted data. As described further below, the transistors may be designed to achieve low ACPR values (a measure of excellent linearity), while still operating at high drain efficiencies and/or high output powers. Such properties enable the transistors to be used in RF power applications including third generation (3G) power applications based on W-CDMA modulation.

Figure 1A:
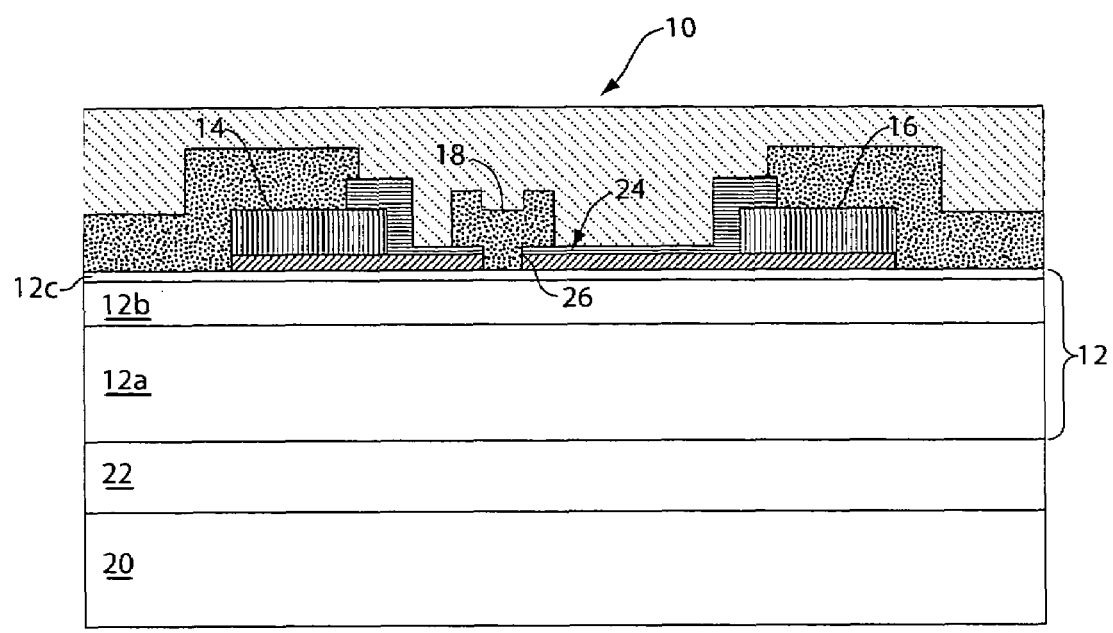
FIGS. 1A and 1B respectively illustrate a cross-section of and top view of a transistor building block structure according to one embodiment of the invention.
Figure 1B:
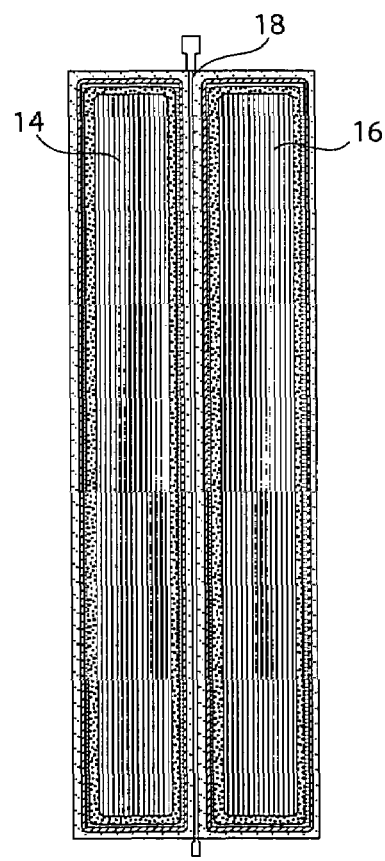

FIGS. 1A and 1B respectively illustrate a cross-section of and top view of a transistor building block structure 10 according to one embodiment of the invention. Structure 10 includes a gallium nitride material region 12. In the illustrative embodiment, the transistor structure includes a source electrode 14, a drain electrode 16 and a gate electrode 18 formed on the gallium nitride material region. The gallium nitride material region is formed on a substrate 20 and, as shown, a transition layer 22 may be formed between the substrate and the gallium nitride material region. The transistor includes a passivating layer 24 that protects and passivates the surface of the gallium nitride material region. In the illustrative embodiment, a via 26 is formed within the passivating layer in which the gate electrode is, in part, formed. As described further below, a plurality of the building block structures 10 may be combined to construct a power transistor device.

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

It should be understood that the transistor structure shown in FIGS. 1A and 1B is illustrative of an embodiment of the invention but should not be considered limiting. Other transistor structures are also within the scope of the present invention including transistor structures with different layer(s), different layer arrangements and different features.

Figure 2:
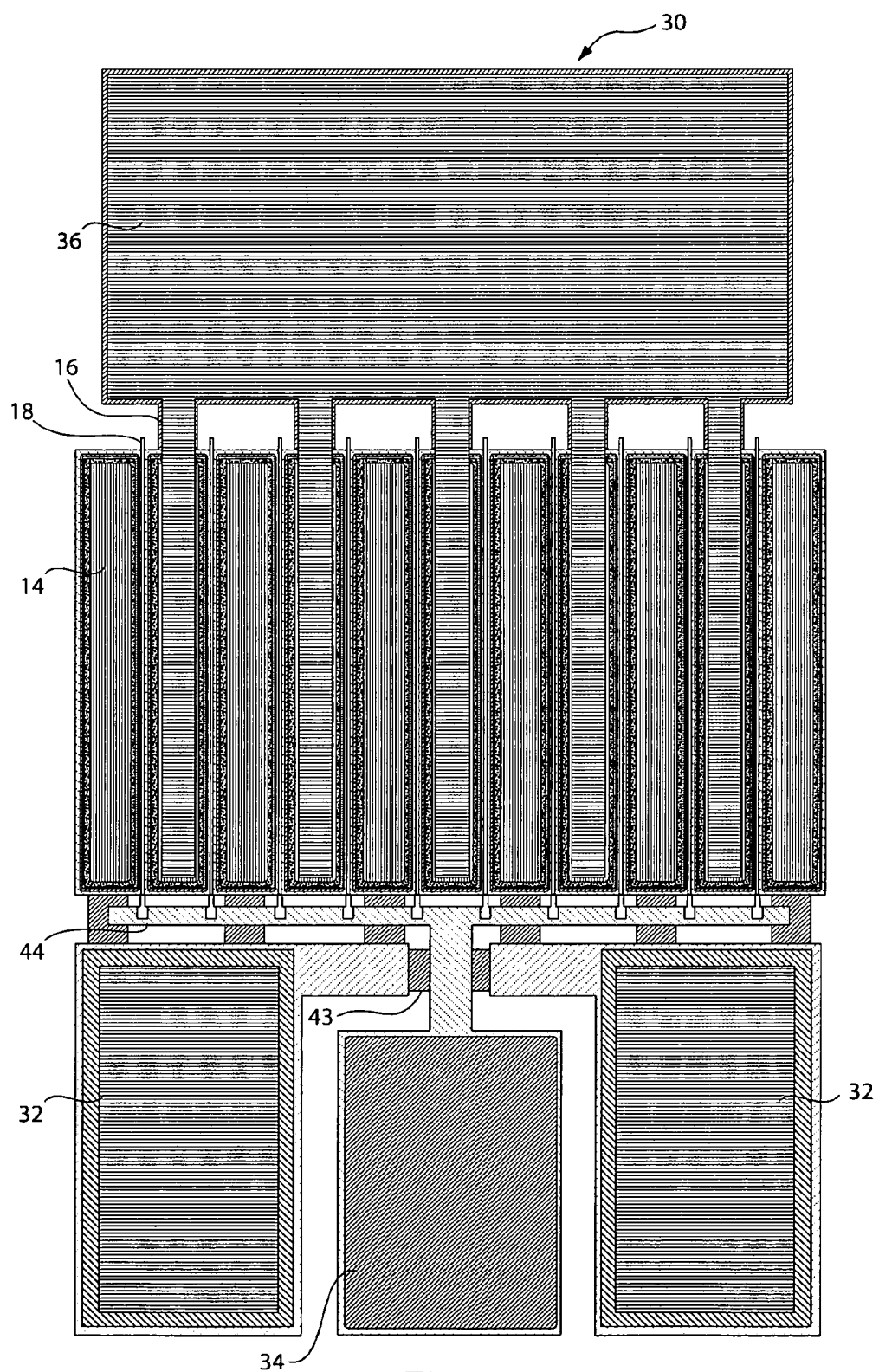
FIG. 2 is a plan view of a transistor unit cell according to one embodiment of the invention.

FIG. 2 is a plan view of a transistor unit cell 30 according to one embodiment of the invention. In this embodiment, the transistor unit cell includes ten transistor building block structures. As shown, the source electrodes in the unit cell are connected to a common source pad 32; the gate electrodes are connected to a common gate pad 34; and, the drain electrodes are connected to a common drain pad 36. In the illustrative unit cell, ten gate electrodes are connected to the gate pad, six source electrodes are connected to source pad, and five drain electrodes are connected to the gate pad.

It should be understood that, in other embodiments of the invention, the transistor unit cell may include a different number of building block structures and/or have different types of electrode and pad connections.

Figure 3:
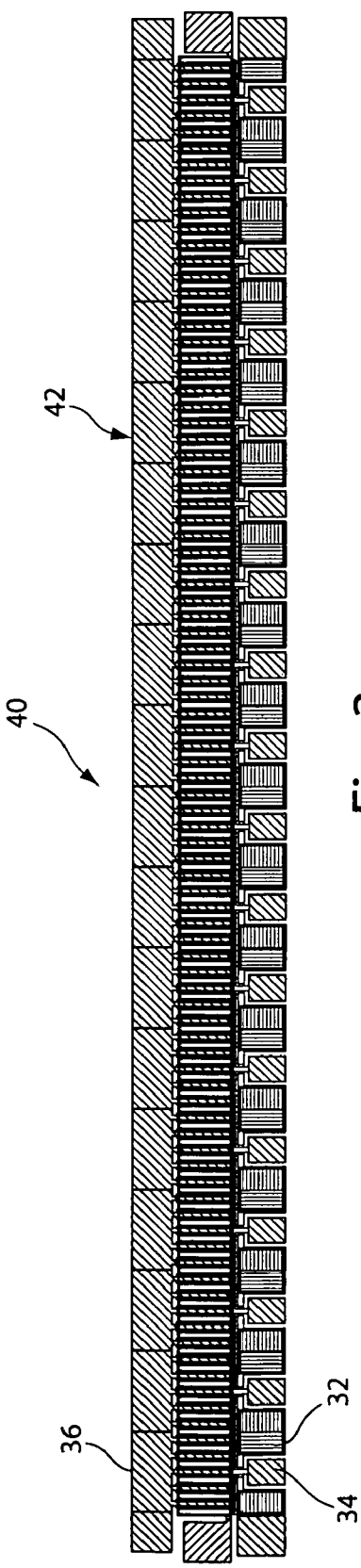
FIG. 3 is a plan view of a power transistor according to one embodiment of the invention.

FIG. 3 is a plan view of a power transistor 40 according to one embodiment of the invention. The power transistor includes multiple transistor unit cells 30 arranged in parallel. In the illustrative embodiment, the transistor includes eighteen unit cells, though other numbers of unit cells are possible. Respective drain pads 36 from the unit cells are aligned to form a drain bus 42. Respective source pads 32 are connected to a source bus 43; and, respective gate pads 34 are connected to a gate bus 44.

Figure 4A:
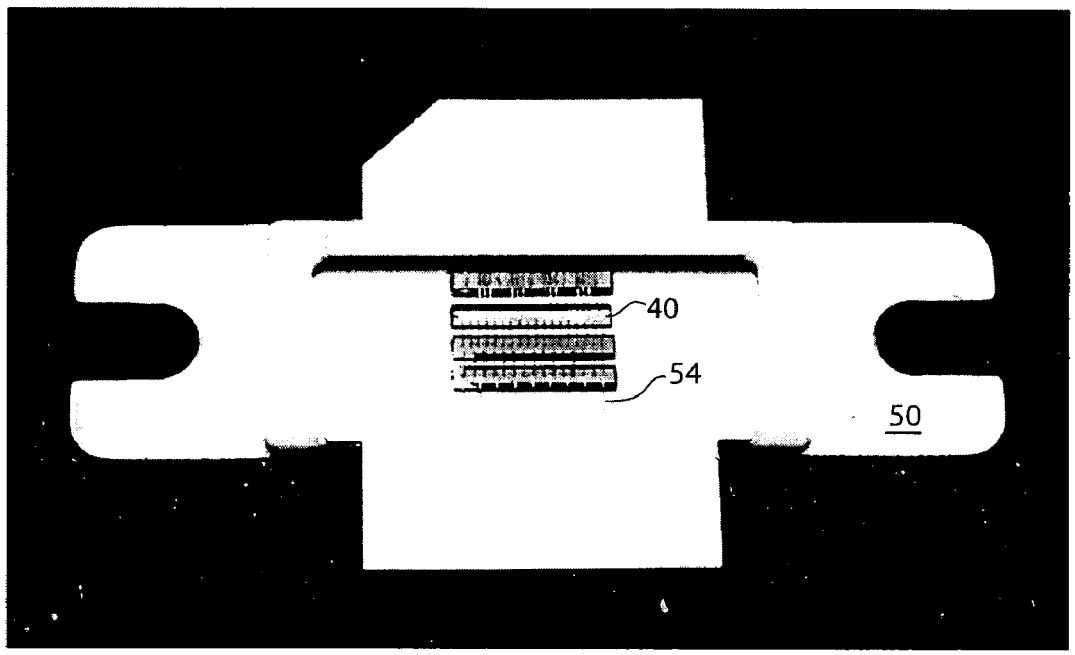
FIG. 4A is a copy of a photo of a power transistor and associated matching network mounted on a package according to one embodiment of the invention.

In some embodiments, power transistor 40 is attached to a package 50 to form a final packaged device 52 as shown in FIG. 4A. As described further below, other components (e.g., matching network components) may also be attached to the package. Bond wires 54 may be used to make electrically connections between the components, the power transistor and the package (as needed). As shown, a single power transistors may be attached to a single package. However, it should also be understood that multiple power transistors may be attached to a single package.

The package may comprise suitable package material known in the art. In some embodiments, the package material is formed of a metal and/or a metal alloy. For example, the package may be formed of a copper/tungsten alloy coated with gold. In some cases, the package may comprise, at least in part, a ceramic material.

In some embodiments, transistors 40 may not be attached to a package. Instead, the transistors may be attached directly to a board, or to a heat sink. When attached to a board, other components may also be attached to the same board.

Transistors of the invention may operate in common source configuration. In this configuration, the source pads (and source electrodes) are connected to ground, the input signal from a source is received by the gate pads (and gate electrodes), and the output signal is transmitted from the drain pads (and drain electrodes) to a load driven by the transistor. However, it is possible, for the transistors to operate in other configurations.

The transistors typically are connected to an impedance matching network which transforms impedance, amongst other functions. The impedance matching network may include an input matching network (e.g., formed between the input signal source and the gate pads) and an output matching network (e.g., formed between the drain pads and the load). The input matching network is designed to transform the input impedance of the transistor to a desired impedance (e.g., to a larger impedance to ease any subsequent external matching). The output matching network is designed to transform the output impedance of the transistor to a desired impedance (e.g., to a larger impedance to ease any subsequent external matching). For example, the transformed input and output impedance may be between 1 ohms and 50 ohms.

The matching network can comprise any component or feature capable of transforming impedance. Such components include devices (e.g., capacitors, inductors, resistors) that transform impedance by a known amount. Thus, the devices may be connected to form a network that transforms the impedance as desired.

Suitable capacitors that may be used in the matching network include conventional capacitor components. Suitable inductors include the bond wires. A number of variables associated with the bond wires (e.g., number, composition, dimensions, proximity to adjacent wires) may be selected to achieve the desired effect.

The components may be mounted to the same entity as the transistor(s) (e.g., package, heat sink or board). In some cases, the components may be separate from the mounted transistors. It may also be possible to form certain components (e.g., capacitors) directly on the same semiconductor substrate as the transistor.

It should be understood that the matching network may include other components or features that transform impedance. For example, dimensions of certain transistor features (e.g., source and gate contact pads) may transform impedance and, thus, may be considered part of the matching network. In some embodiments, the bond wires may be connected to the package, itself, which can make the package part of the matching network. The matching network may also include other components not described herein that transform impedance.

As noted above, the matching network is designed to transform impedance to a desired value. The matching network also may be designed to help achieve desired device performance. For example, the matching network may be designed to effect linearity (e.g., ACPR values), efficiency, gain and output power (or power density). In general, the matching network can be designed by arranging the components and features in a manner that achieves the desired result. Typically, device simulation tools and experimentation can be used to test and optimize the design.

Figure 4B:
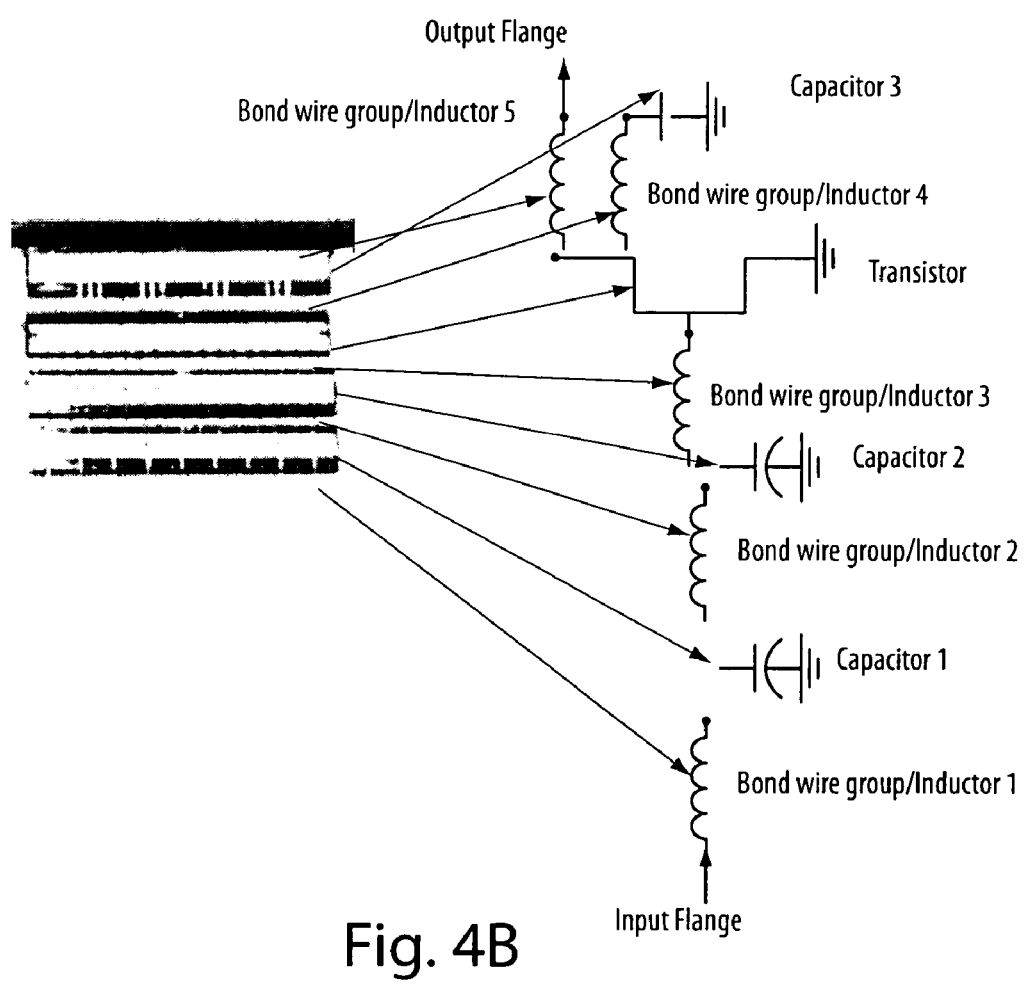
FIG. 4B shows the power transistor and matching network of FIG. 4A and the associated circuit elements.

A variety of matching network designs may be suitable. One suitable matching network is shown in the embodiment of FIGS. 4A and 4B. In this embodiment, the input matching network includes an arrangement of components positioned between a package input lead (flange) and each respective gate pad. The arrangement includes the following components as shown: inductor 1, capacitor 1, capacitor 2 and inductor 3. Inductor 1 is a bond wire group connecting the package to the first capacitor. Inductor 2 is a bond wire group connecting capacitor 1 and capacitor 2. Inductor 3 is a bond wire group connecting capacitor 2 to the transistor. Capacitors 1–2 are separate capacitor components.

The output matching network includes an arrangement of components positioned between each respective drain pad and a package output lead (flange). The arrangement includes the following components as shown: inductor 4, capacitor 3 and inductor 5. Inductor 4 is a bond wire group connecting the transistor and capacitor 3 and inductor 5 is a bond wire group connecting capacitor 3 and the output lead.

In some embodiments, inductors 1–5 have an inductance between 50 picoHenry and 1000 picoHenry; and, in some embodiments, between 75 picoHenry and 350 picoHenry. For example, in one suitable matching network, inductor 1 is 103 picoHenry; inductor 2 is 150 picohenry, inductor 3 is 300 picoHenry, inductor 4 is 270 picohenry, and inductor 5 is 290 picoHenry.

In some embodiments, capacitor 1–2 have a capacitance between about 5 picoFarad and 100 picoFarad. In some embodiments, capacitor 3 has a capacitance between about 50 picoFarad and 1000 picoFarad; and, in some embodiments, between 50 picoFarad and 500 picoFarad. For example, in one suitable matching network, capacitor 1 is 30 picoFarad, capacitor 2 is 25 picoFarad and capacitor 3 is 125 picoFarad.

The matching network shown in FIGS. 4A and 4B may be used to achieve excellent performance characteristics including high ACPR, efficiency and power density, as described further below. However, it should be understood that other matching networks are also suitable.

As noted above, transistors of the invention can exhibit attractive electrical properties including excellent linearity, high efficiencies, high output power and high gain.

Figure 5:
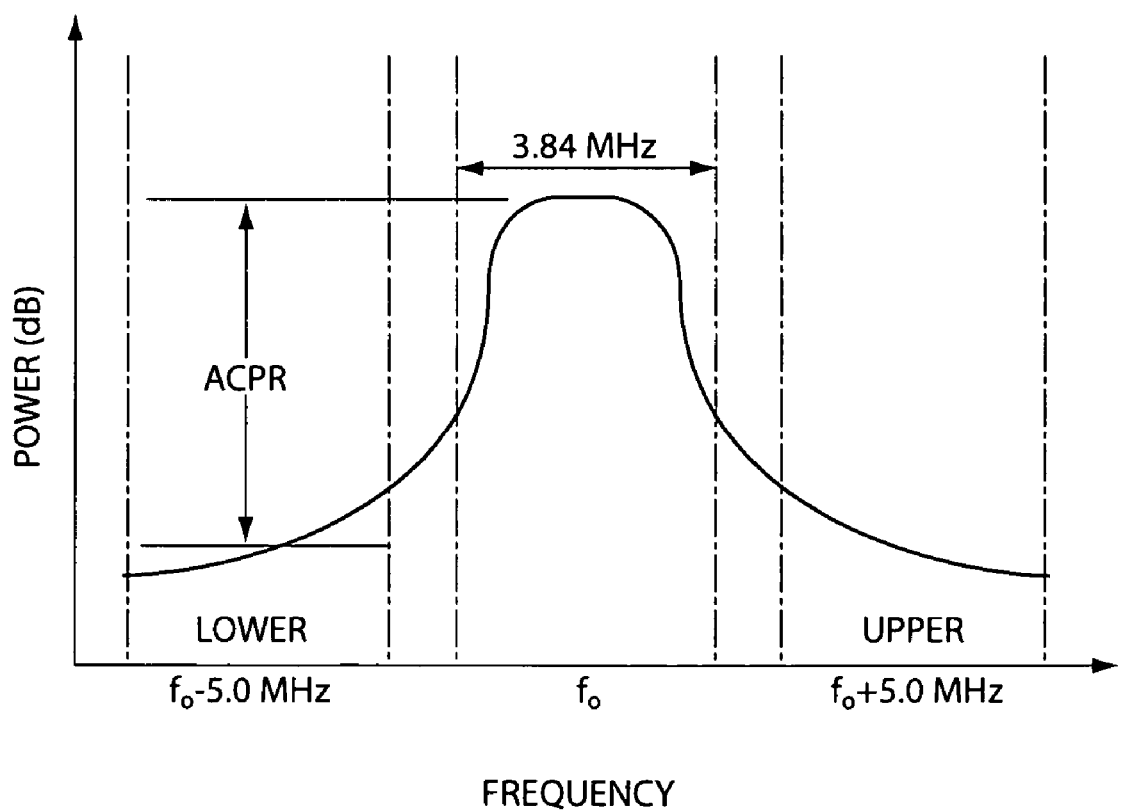
FIG. 5 shows a waveform including parameters used to calculate ACPR.

As known to those of skill in the art, linearity can be characterized by ACPR (adjacent channel power ratio) measurements. In particular, ACPR measurements may be used to characterize the linearity of transistors that are used in W-CDMA applications. In general, ACPR is the ratio of power transmitted in an adjacent frequency channel over the power transmitted in the main frequency channel. Specifically, ACPR is the ratio of the larger of the two integrated adjacent frequency channel powers (either upper or lower) divided by the integrated main frequency channel power (see FIG. 5). One suitable way of measuring ACPR is using WCDMA Test Model 1 of 3G spec TS 25.141, which calls for a single carrier with 64 users and 100% clipping (corresponding to a PAR of 9.8 dB @ 0.01%) measured with a 3.84 MHz channel bandwidth and an adjacent channel offset by 5 MHz. It should be understood that ACPR may be measured for signals transmitted in different main frequency channels (e.g., for channels located anywhere in the RF spectrum) and/or signals having a multiple carrier signals.

ACPR is typically reported in decibels relative to the main signal (dBc). For example, an ACPR of −10 dBc refers to when power transmitted in adjacent transmission channels is 10 times lower than in the main channel; an ACPR of −20 dBc refers to when power transmitted in adjacent transmission channels is 100 times lower than in the main channel; and, an ACPR of −30 dBc refers to when power transmitted in adjacent transmission channels is 1000 times lower than in the main channel.

Transistors of the invention may exhibit an ACPR of less than or equal to about −20 dBc. In some embodiments, the ACPR is less than or equal to −29 dBc; in some embodiments, the ACPR is less than or equal to −39 dBc (e.g., between −39 and −45); and, in some embodiments, the ACPR is less than or equal to −42 dBc. Other ACPR values are also achievable.

The transistor may be designed to have a certain ACPR based on its application. ACPR may be controlled, in part, by the matching network, operating conditions and other design features (e.g., layer composition, gate length, gate pitch, amongst others). High ACPR values may contribute to sacrificing other properties such as efficiency and output power. In some cases, an ACPR of greater than −45 dBc may be desired to limit sacrifices to other properties. However, advantageously, transistors of the invention may exhibit a sufficiently low ACPR for many RF power transistor applications (such as transistors for the 3G market), while also exhibiting sufficiently high efficiencies and output power, as described further below.

The above-noted ACPR values are even achievable in the absence of processing of the W-CDMA signal (e.g., digital pre-distortion, feed-forward, crest factor reduction).

Efficiency (i.e., drain efficiency) is defined as the output power divided by the drain current multiplied by the drain voltage. Transistors of the invention may operate at efficiencies of greater than or equal to 20% (e.g., between 22% and 30%). In some embodiments, the transistors operate at efficiencies of greater than or equal to 30%; and, in some embodiments, the transistors operate at efficiencies of greater than or equal to 40%. High efficiencies may contribute to sacrificing other properties such as ACPR and output power and, thus, in some cases, efficiencies of less than 45% may be desired. The efficiency may be controlled, in part, by the matching network, operating conditions and other design features (e.g., layer composition, gate length, gate pitch, amongst others).

Transistors of the invention may operate at these efficiencies with the above-noted ACPR values. For example, the transistors may operate at an ACPR of less than or equal to −20 dBc and an efficiency of greater than or equal to 20% (e.g., between 20% and 45% or between 20% and 35%). The transistors may operate at an ACPR of less than or equal to −32 dBc and an efficiency of greater than or equal to 20% (e.g., between 20% and 45% or between 20% and 35%). In some embodiments, the transistors may operate at an ACPR of less than or equal to −39 dBc and an efficiency of greater than or equal to 20% (e.g., between 20% and 40% or between 20% and 35%).

It should be understood that transistors of the invention may have other combinations of efficiency and ACPR values.

Output power may be measured using standard techniques. It may be useful to express output power in terms of power density which is the output power divided by the gate periphery (W/mm). The output power depends largely on the size of the transistor. In some cases, the output power is between about 10 W and about 40 W.

Transistors of the invention may have power densities of greater than or equal to 0.1 W/mm. In some embodiments, the power density may be greater than or equal to 0.5 W/mm; and, in some embodiments, the power density may be greater than or equal to 1.0 W/mm. In some cases, power densities of less than or equal to 10 W/mm may be desired to limit sacrifices to other properties such as ACPR values and efficiency. The power density may be controlled, in part, by the matching network, operating conditions and other design features (e.g., layer composition, gate length, gate pitch, amongst others).

Transistors of the invention may operate at these power densities with the above-noted ACPR values (and efficiency values). For example, the transistors may operate at an ACPR of less than or equal to −20 dBc and a power density of greater than or equal to 0.1 W/mm (e.g., between 0.1 W/mm and 10 W/mm, or between 1.0 W/mm and 10 W/mm). In some embodiments, the transistors may operate at an ACPR of less than or equal to −32 dBc and a power density of greater than or equal to 0.1 W/mm (e.g., between 0.1 W/mm and 10 W/mm, or between 0.1 W/mm and 1 W/mm). In some embodiments, the transistors may operate at an ACPR of less than or equal to −39 dBc and a power density of greater than or equal to 0.1 W/mm (e.g., between 0.1 W/mm and 10 W/mm, or between 0.1 W/mm and 1 W/mm).

Transistors of the invention may also operate at sufficient gains for RF power transistors markets (including 3G applications). Gain is defined as the output power divided by the input power and may be expressed in units of dB. Transistors of the invention may have a gain of greater than or equal to 5 dB. In some embodiments, the gain may be greater than or equal to 12 dB (e.g., between 12 and 15). In some cases, a gain of less than or equal to 18 dB may be desired to limit sacrifices to other properties.

As noted above, bias conditions also may be used to control ACPR, efficiency and output power. As described further in Example 1, it has been discovered that operating under class AB conditions may be preferable to achieve the desired linearity (and ACPR) combined with efficiency and output power. As known to those of skill in the art, class AB operation is when the transistor is biased in such a way that current flows in the device for 51%–99% of the input signal. Class AB is between class A which operates on 100% of the input signal and class B which operates on 50% of the input signal. It may be particularly preferred to operate in deep class AB as near to maximum linear power as possible. In some embodiments, it may be preferred to operate between 51% and 75% of the input signal; in some cases, between 51% and 60% (e.g., about 55%).

Operating in class AB conditions may lead to formation of a relatively constant ACPR plateau (e.g., See Example 1) extends over a range of each of drain efficiency, output power and power density. For example, the ACPR may vary by less than 10% over a range of 3 dB of output power, or even over a range of 5 dB or greater. Also, the ACPR may vary by less than 10% over a range of 5% efficiency, or even over a range of 10% efficiency or greater.

However, it should be understood that it may also be possible to achieve the desired linearity when operating under other classes if operation (other than AB) in some embodiments of the invention.

In some cases, the devices are operated at drain voltages of up to 300 Volts. In some cases, the drain voltage may be up to 100 Volts or up to 50 Volts (e.g., 28 Volts or 48 Volts). Suitable gate voltages may be between 0 Volts and −10 Volts.

It should also be understood that transistors of the invention may operate simultaneously at the above-noted ACPR values, while exhibiting the above-noted power densities, efficiencies and gains.

The properties noted above enable transistors of the invention to be used in RF power applications. In particular, the transistors may be suitable for third generation (3G) power applications based on W-CDMA modulation. However, it should be understood, that devices of the invention may be used in other applications based on variations of W-CDMA and other modulation schemes (e.g., GSM, UMTS, EDGE, CDMA-2000, amongst others). The transistor may be based on modulation schemes including multiple carrier waves.

Referring again to FIG. 1, gallium nitride material region 12 of the transistor structure functions as the active region. That is, the conductive channel extending from the source electrode to the drain electrode is formed in the gallium nitride material region. The gallium nitride material region comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 incorporated herein by reference.

In some cases, the gallium nitride material region includes only one gallium nitride material layer. In other cases, the gallium nitride material region includes more than one gallium nitride material layer. For example, the gallium nitride material region may include multiple layers (12a, 12b, 12c), as shown. In certain embodiments, it may be preferable for the gallium nitride material of layer 12b to have an aluminum concentration that is greater than the aluminum concentration of the gallium nitride material of layer 12a. For example, the value of x in the gallium nitride material of layer 12b (with reference to any of the gallium nitride materials described above) may have a value that is between 0.05 and 1.0 greater than the value of x in the gallium nitride material of layer 12a, or between 0.05 and 0.5 greater than the value of x in the gallium nitride material of layer 12a. For example, layer 12b may be formed of $Al_{0.26}Ga_{0.74}N$, while layer 12a is formed of GaN. This difference in aluminum concentration may lead to formation of a highly conductive region at the interface of the layers 12a, 12b (i.e., a 2-D electron gas region). In the illustrative embodiment, layer 12c may be formed of GaN.

Gallium nitride material region 12 also may include one or more layers that do not have a gallium nitride material composition such as other III–V compounds or alloys, oxide layers, and metallic layers.

The gallium nitride material region is of high enough quality so as to permit the formation of devices therein. Preferably, the gallium nitride material region has a low crack level and a low defect level. As described further below, transition layer 22 (particularly when compositionally-graded) may reduce crack and/or defect formation. Gallium nitride materials having low crack levels have been described in U.S. Pat. No. 6,649,287 incorporated by reference above. In some cases, the gallium nitride material region a crack level of less than 0.005 $\mu m/\mu m^2$. In some cases, the gallium nitride material region has a very low crack level of less than 0.001 $\mu m/\mu m^2$. In certain cases, it may be preferable for gallium nitride material region to be substantially crack-free as defined by a crack level of less than 0.0001 $\mu m/\mu m^2$.

In some embodiments, gallium nitride materials having low dislocation densities may be preferred. Suitable gallium nitride materials and processes for forming the same are described in commonly-owned, co-pending U.S. patent application Ser. No. 10/886,506, filed Jul. 7, 2004, entitled "III-Nitride Materials Including Low Dislocation Densities and Methods Associated With the Same".

In certain cases, the gallium nitride material region includes a layer or layers which have a monocrystalline structure. In some cases, the gallium nitride material region includes one or more layers having a Wurtzite (hexagonal) structure.

The thickness of the gallium nitride material region and the number of different layers are dictated, at least in part, by the requirements of the specific device. At a minimum, the thickness of the gallium nitride material region is sufficient to permit formation of the desired structure or device. The gallium nitride material region generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or even greater than 5.0 microns.

As noted above, the device includes passivating layer 24 formed on the surface of gallium nitride material region 12. Suitable passivating layers (some of which also function as electrode-defining layers) have been described in commonly-owned, co-pending U.S. patent application Ser. No. 10/740,376, filed Dec. 17, 2003, entitled "Gallium Nitride Material Devices Including an Electrode-Defining Layer and Methods of Forming The Same", which is incorporated herein by reference.

Suitable compositions for passivating layer 24 include, but are not limited to, nitride-based compounds (e.g., silicon nitride compounds), oxide-based compounds (e.g., silicon oxide compounds), polyimides, other dielectric materials, or combinations of these compositions (e.g., silicon oxide and silicon nitride). In some cases, it may be preferable for the passivating layer to be a silicon nitride compound (e.g., $Si_3N_4$) or non-stoichiometric silicon nitride compounds.

In certain preferred embodiments, substrate 20 is a silicon substrate. Silicon substrates may be preferred because they are readily available, relatively inexpensive and are of high crystalline quality.

As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

It should be understood that other types of substrates may also be used including sapphire, silicon carbide, indium phosphide, silicon germanium, gallium arsenide, gallium nitride material, aluminum nitride, or other III–V compound substrates. However, in embodiments that do not use silicon substrates, all of the advantages associated with silicon substrates may not be achieved.

It should also be understood that though the illustrative embodiments include a substrate, other embodiments of the invention may not have a substrate. In these embodiments, the substrate may be removed during processing. In other embodiments, the substrate may also function as the gallium nitride material region. That is, the substrate and gallium nitride material region are the same region.

Substrate 20 may have any suitable dimensions and its particular dimensions are dictated, in part, by the application and the substrate type. Suitable diameters may include, but are not limited to, 2 inches (50 mm), 4 inches (100 mm), 6 inches (150 mm), and 8 inches (200 mm).

In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, when using thinner substrates. In other embodiments, thinner substrates (e.g., less than 125 microns) are used. Though thinner substrates may not have the advantages associated with thicker substrates, thinner substrates can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). In the illustrative embodiments, the regions/layers formed on the substrate (e.g., transition layer, gallium nitride material region, and the like) may also be substantially planar. As described further below, such regions/layers may be grown in vertical (e.g., non-lateral) growth processes. Planar substrates and regions/layers can be advantageous in some embodiments, for example, to simplify processing. Though it should be understood that, in some embodiments of the invention, lateral growth processes may be used as described further below.

Transition layer 22 may be formed on substrate 20 prior to the deposition of gallium nitride material region 12. The transition layer may accomplish one or more of the following: reducing crack formation in the gallium nitride material region 12 by lowering thermal stresses arising from differences between the thermal expansion rates of gallium nitride materials and the substrate; reducing defect formation in gallium nitride material region by lowering lattice stresses arising from differences between the lattice constants of gallium nitride materials and the substrate; and, increasing conduction between the substrate and gallium nitride material region by reducing differences between the band gaps of substrate and gallium nitride materials. The presence of the transition layer may be particularly preferred when utilizing silicon substrates because of the large differences in thermal expansion rates and lattice constant between gallium nitride materials and silicon. It should be understood that the transition layer also may be formed between the substrate and gallium nitride material region for a variety of other reasons. In some cases, for example when a silicon substrate is not used, the device may not include a transition layer.

The composition of transition layer 22 depends, at least in part, on the type of substrate and the composition of gallium nitride material region 12. In some embodiments which utilize a silicon substrate, the transition layer may preferably comprise a compositionally-graded transition layer having a composition that is varied across at least a portion of the layer. Suitable compositionally-graded transition layers, for example, have been described in commonly-owned U.S. Pat. No. 6,649,287, entitled "Gallium Nitride Materials and Methods," filed on Dec. 14, 2000, which is incorporated herein by reference. Compositionally-graded transition layers are particularly effective in reducing crack formation in the gallium nitride material region by lowering thermal stresses that result from differences in thermal expansion rates between the gallium nitride material and the substrate (e.g., silicon). In some embodiments, when the compositionally-graded, transition layer is formed of an alloy of gallium nitride such as $Al_xIn_yGa_{(1-x-y)}N$, $Al_xGa_{(1-x)}N$, or $In_yGa_{(1-y)}N$, wherein $0 \leq x \leq 1$, $0 \leq y \leq 1$. In these embodiments, the concentration of at least one of the elements (e.g., Ga, Al, In) of the alloy is typically varied across at least a portion of the cross-sectional thickness of the layer. For example; when the transition layer has an $Al_xIn_yGa_{(1-x-y)}N$ composition, x and/or y may be varied; when the transition layer has a $Al_xGa_{(1-x)}N$ composition, x may be varied; and, when the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within the gallium nitride material region. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer). The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

In some cases, the transition layer has a monocrystalline structure.

It should be understood that, in some embodiments, transition layer 22 has a constant (i.e., non-varying) composition across its thickness.

The source, drain and gate electrodes may be formed of any suitable conductive material such as metals (e.g., Au, Ni, Pt), metal compounds (e.g., WSi, WSiN), alloys, semiconductors, polysilicon, nitrides, or combinations of these materials. In particular, the dimensions of the gate electrode can be important to device performance. In the illustrative embodiment, via 26 formed in the passivating layer defines (at least in part) the gate electrode dimensions. Thus, by controlling the shape of the via, it is possible to define desired gate dimensions. Suitable via and gate dimensions have been described in U.S. patent application Ser. No. 10/740,376, incorporated by reference above.

In some embodiments, electrodes may extend into the gallium nitride material region. For example, electrode material (e.g., metal) deposited on the surface of the gallium nitride material region may diffuse into the gallium nitride material region during a subsequent annealing step (e.g., RTA) when forming the electrode. In particular, the source and drain electrodes may include such a portion diffused into the gallium nitride material region. As used herein, such electrodes are still considered to be formed on the gallium nitride material region.

Source, gate and drain pads may be formed of any suitable conductive material such as metals (e.g., Au, Ni, Pt), metal compounds (e.g., WSi, WSiN), alloys, semiconductors, polysilicon, nitrides, or combinations of these materials. In some embodiments, the pads are formed of the same material as the corresponding electrodes.

The device shown in FIGS. 1A and 1B also includes an encapsulation layer 36 which, as known to those of skill in the art, encapsulates underlying layers of the structure to provide chemical and/or electrical protection. The encapsulation layer may be formed of any suitable material including oxides or nitrides.

It should be understood that the transistor structure may include other layers. For example, the transistor structure may include additional features not shown in FIGS. 1A and 1B. For example, the transistor structure may include a strain-absorbing layer formed directly on the surface of substrate 20. Suitable strain-absorbing layers have been described in commonly-owned, co-pending U.S. patent application Ser. No. 10/879,703, entitled "Gallium Nitride Materials and Methods Associated With the Same", filed Jun. 28, 2004, which is incorporated herein by reference. In one embodiment, it may be preferable for the strain-absorbing layer to be very thin (e.g., thickness of between about 10 Angstroms and about 100 Angstroms) and formed of an amorphous silicon nitride-based material.

In some embodiments, other layers (e.g., intermediate layers) may be present. Suitable intermediate layers, for example, have been described and illustrated in U.S. Pat. No. 6,649,287, which was incorporated by reference above. In other embodiments of the invention, layer(s) shown herein may not be present. Other variations to the structures and devices shown herein would be known to those of skill in the art and are encompassed by the present invention.

Structures and devices of the present invention may be formed using methods that employ conventional processing techniques. In general the stack of material layers is formed on a substrate which is later processed (e.g., diced) to form the desired final structure (e.g., transistor).

For example, the layers and regions of the transistor structure of FIGS. 1A and 1B may be formed, patterned, etched and implanted using conventional techniques.

Transition layer 22 and gallium nitride material region 12 may be deposited, for example, using metal organic chemical vapor deposition (MOCVD), molecular beam epitaxy (MBE), and hydride vapor phase epitaxy (HVPE), amongst other techniques. The preferred technique may depend, in part, on the composition of the layers. An MOCVD process may be preferred. A suitable MOCVD process to form a transition layer (e.g., a compositionally-graded transition layer) and gallium nitride material region over a silicon substrate has been described in U.S. Pat. No. 6,649,287 incorporated by reference above. When the semiconductor material region has different layers, in some cases it is preferable to use a single deposition step (e.g., an MOCVD step) to form the entire gallium nitride material region. When using the single deposition step, the processing parameters are suitably changed at the appropriate time to form the different layers. In certain preferred cases, a single growth step may be used to form the transition layer and the gallium nitride material region.

When present, the stress-absorbing layer may be formed using techniques described in U.S. patent application Ser. No. 10/879,703 which is incorporated by reference above.

Passivating layer 24 may be deposited using any suitable technique. The technique used, in part, depends on the composition of the passivating layer. Suitable techniques include, but are not limited to CVD, PECVD, LP-CVD, ECR-CVD, ICP-CVD, evaporation and sputtering. When the passivating layer is formed of a silicon nitride material, it may be preferable to use PECVD to deposit the layer.

When present, via 26 may be formed within the passivating layer using an etching technique. A plasma etching technique is preferably used to form the via with controlled dimensions Source, drain and gate electrodes may be deposited on the gallium nitride material region using known techniques such as an evaporation technique. In cases when the electrodes include two metals, then the metals are typically deposited in successive steps. The deposited metal layer may be patterned using conventional methods to form the electrodes. In some embodiments, an annealing step (e.g., RTA) may also be used in which the deposited electrode material diffuses into the gallium nitride material region, particularly when forming source and drain electrodes.

Suitable techniques for forming the passivating layer, via and electrodes have been described in commonly owned, co-pending U.S. patent application Ser. No. 10/740,376, which is incorporated herein by reference above.

Source, drain and gate electrode pads may also be deposited and patterned using known techniques.

In some embodiments, an isolation region may be formed which electrical isolates the active region. Suitable processes for forming isolation region have been described in commonly owned, co-pending U.S. patent application Ser. No. 10/879,795, filed Jun. 28, 2004, entitled "Gallium Nitride Material Structures Including Isolation Regions and Methods", which is incorporated herein by reference above.

The above-described processes are used to form a semiconductor wafer including the desired material layers and features. The wafer may be further processed using conventional techniques to produced the desired structure. In some methods, the wafer may be thinned from its backside. A metallic layer (e.g., gold) may then be deposited on the backside. The wafer may be diced to form transistors (e.g., die) which can be further processed. When mounting on a package, the transistor may be placed in the package and subjected to a heating step sufficient to weld the transistor to the packaging material. In other embodiments, the transistors are mounted to other entities (e.g., a heat sink) using known techniques.

It should be understood that the invention encompasses other methods than those specifically described herein. Also, variations to the methods described above would be known to those of ordinary skill in the art and are within the scope of the invention.

The following examples are not limiting and are presented for purposes of illustration.

EXAMPLE 1

The following example illustrates the characterization of the performance of a gallium nitride transistor of the present invention.

A transistor similar to the transistor illustrated in FIG. 3 was manufactured. The transistor comprised transistor building block structures similar to the structure illustrated in FIG. 1A. The transistor was mounted to a package similar to the packaged transistor shown in FIG. 4 and included a similar matching network as described above with inductor 1 being 103 picoHenry; inductor 2 being 150 picoHenry, inductor 3 being 300 picoHenry, inductor 4 being 270 picoHenry, inductor 5 being 290 picoHenry, capacitor 1 being 30 picoFarad, capacitor 2 being 25 picoFarad and capacitor 3 being 125 picoFarad.

The transistor was operated under two bias conditions within class AB operation: 1000 mA (e.g., 53% of input signal) and 25000 mA (e.g., 57% of input signal) At each operating condition, the ACPR, drain efficiency and output power were measured.

The ACPR of the transistor was measured using "Test Model 1 of 3G spec TS 25.141". In this embodiment, ACPR is measured using WCDMA Test Model 1 of 3G spec TS 25.141, which calls for a single carrier with 64 users and 100% clipping (corresponding to a PAR of 9.8 dB @ 0.01%) measured with a 3.84 MHz channel bandwidth and an adjacent channel offset by 5 MHz.

Figure 6A:
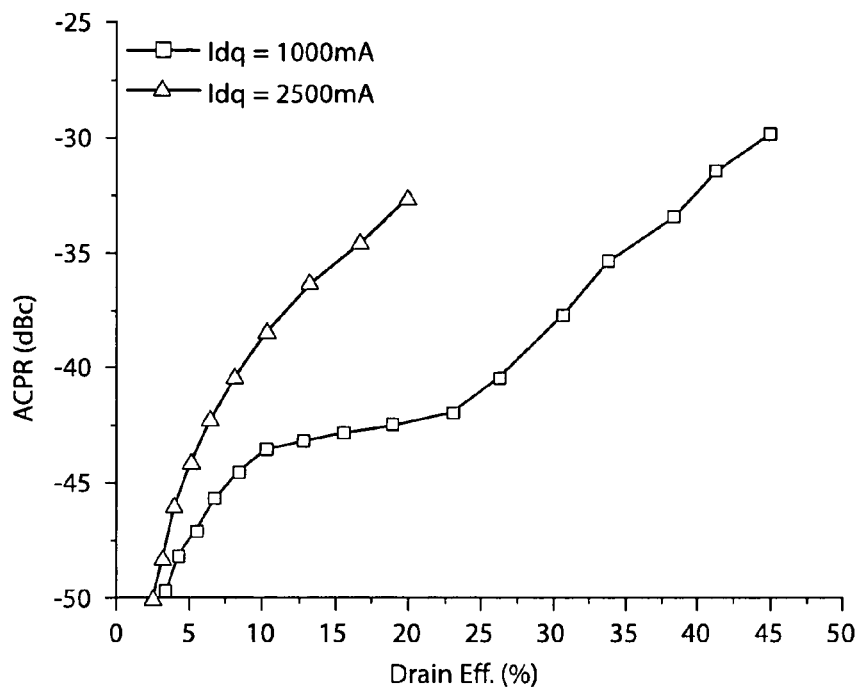
FIG. 6A shows ACPR as a function of drain efficiency for a transistor operated under the different bias conditions as described in Example 1.
Figure 6B:
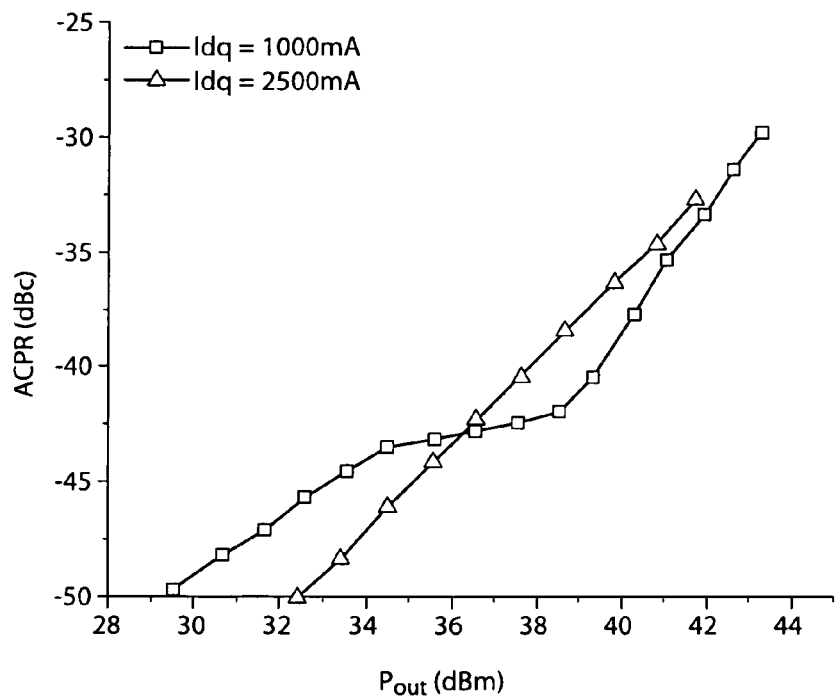
FIG. 6B shows ACPR as a function of power density for a transistor operated under the different bias conditions as described in Example 1.
Figure 6C:
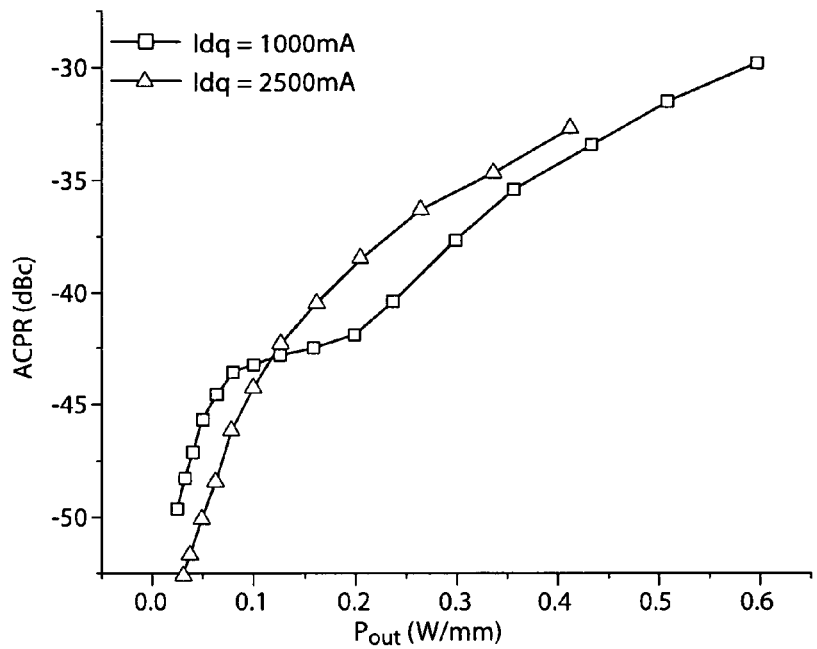
FIG. 6C shows ACPR as a function of output power for a transistor operated under the different bias conditions as described in Example 1.

FIG. 6A shows ACPR as a function of drain efficiency for the transistor operated under the different bias conditions. FIG. 6B shows ACPR as a function of power density for the transistor operated under different bias conditions. FIG. 6C shows ACPR as a function of output power for the transistor operated under different bias conditions The results establish that transistors of the invention can operate at low ACPR values, as well as high efficiencies and power densities, when operating under class AB operation. Furthermore, the results show that within class AB operation, performance may be controlled (at least in part) by the biasing conditions. Also, the results show that it is possible to form an ACPR plateau that extends over a range of each of drain efficiency, output power and power density using the AB conditions.

EXAMPLE 2

The following example illustrates the characterization of the performance of a gallium nitride transistor of the present invention.

A transistor similar to the transistor illustrated in FIG. 3 was manufactured. The transistor comprised transistor building block structures similar to the structure illustrated in FIG. 1A. The transistor was mounted to a package similar to the packaged transistor shown in FIG. 4. The performance of the transistor, as described in connection with Example 1, was evaluated in connection with two matching networks. Both matching networks have a design similar to that shown in FIG. 4. The first matching network included components having the following values: inductor 1 being 103 picohenry; inductor 2 being 150 picoHenry, inductor 3 being 300 picoHenry, inductor 4 being 270 picoHenry, inductor 5 being 290 picoHenry, capacitor 1 being 30 picoFarad, capacitor 2 being 30 picoFarad and capacitor 3 being 125 picoFarad. The second matching network was identical except capacitor 2 was 50 picoFarad.

The ACPR of the transistor was measured using "Test Model 1 of 3G spec TS 25.141". In this embodiment, ACPR is measured using WCDMA Test Model 1 of 3G spec TS 25.141, which calls for a single carrier with 64 users and 100% clipping (corresponding to a PAR of 9.8 dB @ 0.01%) measured with a 3.84 MHz channel bandwidth and an adjacent channel offset by 5 MHz.

Figure 7A:
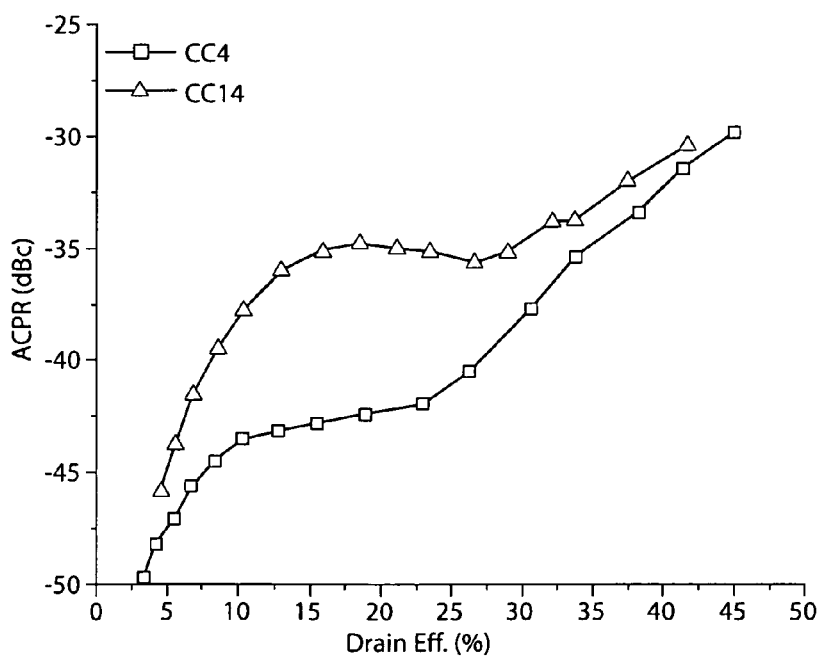
FIG. 7A shows ACPR as a function of drain efficiency for a transistor of the invention operated using different matching networks as described in Example 2.
Figure 7B:
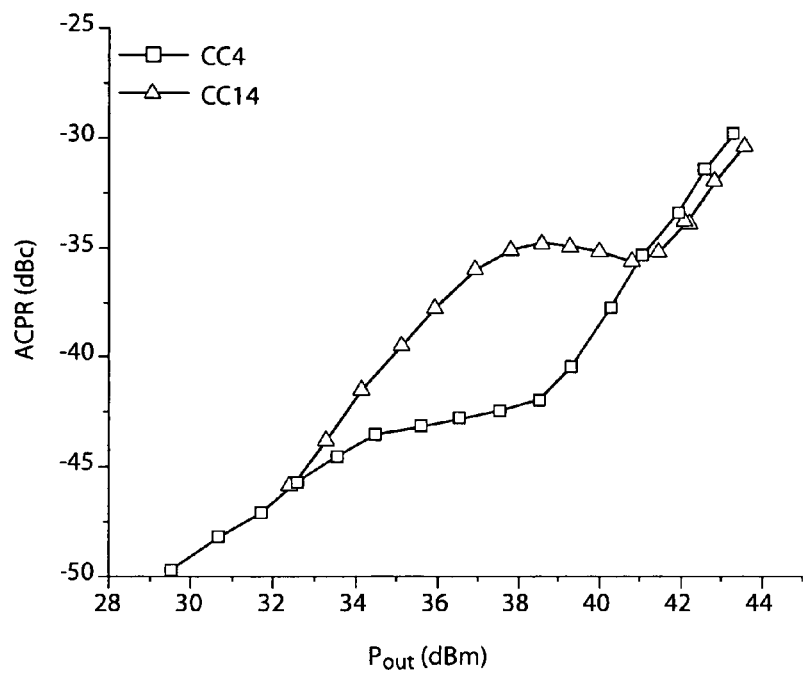
FIG. 7B shows ACPR as a function of power density for a transistor of the invention operated using different matching networks as described in Example 2.
Figure 7C:
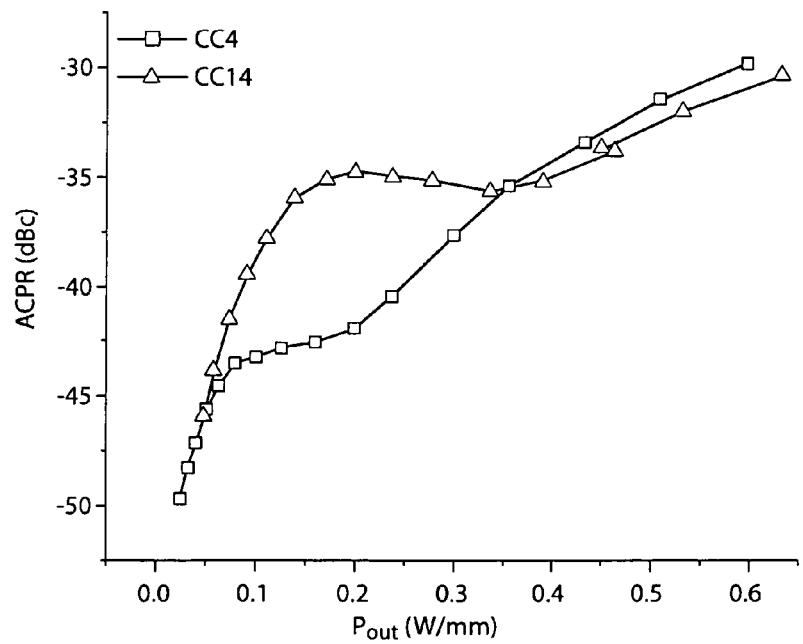
FIG. 7C shows ACPR as a function of output power for a transistor of the invention operated using different matching networks as described in Example 2.

FIG. 7A shows ACPR as a function of drain efficiency for the transistor operated with different matching networks. FIG. 7B shows ACPR as a function of power density for the transistor operated with different matching networks. FIG. 7C shows ACPR as a function of output power for the transistor operated with different matching networks.

The results establish that transistors of the invention can operate at low ACPR values, as well as high efficiencies and power densities. The results also establish that matching network can be used to change performance characteristics.

EXAMPLE 3

The following example illustrates the characterization of the performance of a gallium nitride transistor of the present invention.

A transistor similar having 8 unit cells was manufactured. The transistor comprised transistor building block structures similar to the structure illustrated in FIG. 1A. The transistor was mounted to a simple package and matching network.

Figure 8A:
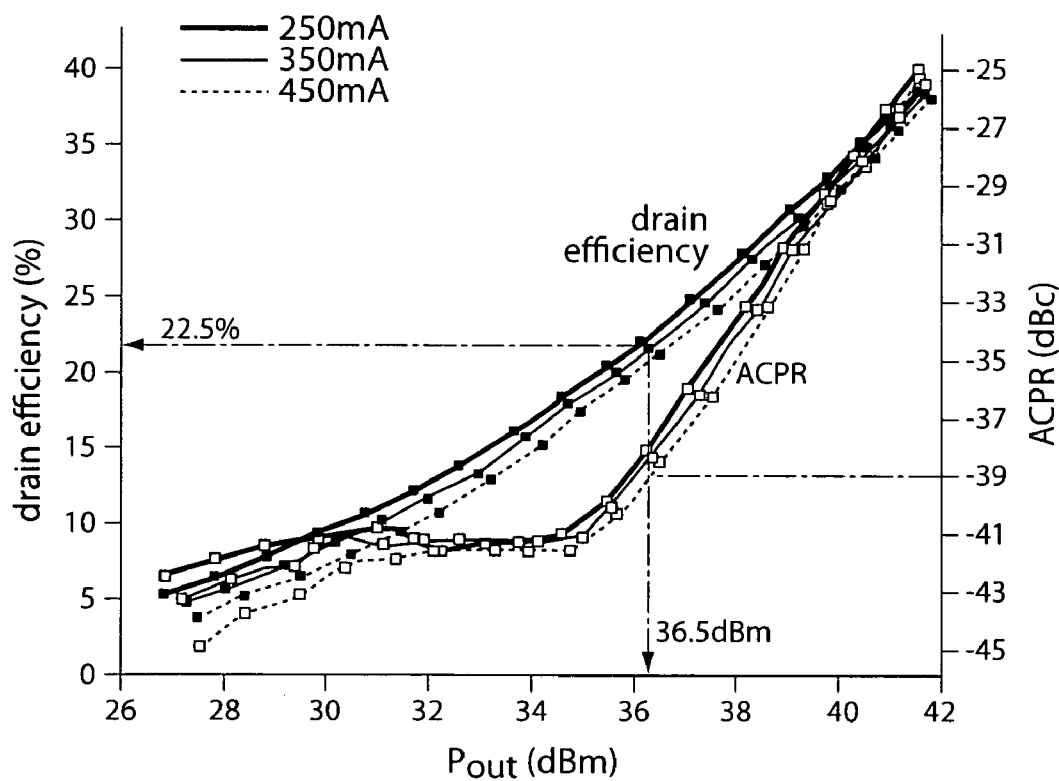
FIG. 8A shows a single-tone power-sweep for a transistor of the invention as described in Example 3.
Figure 8B:
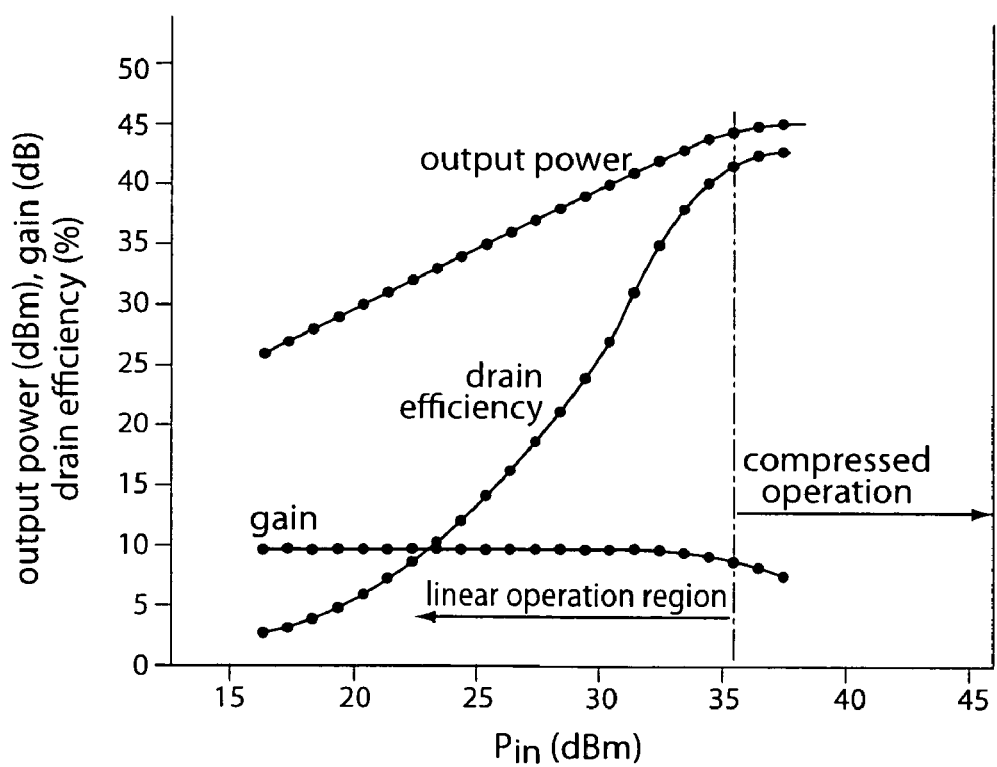
FIG. 8B shows efficiency and ACPR as a function of output power for a transistor of the invention as described in Example 3.

The performance of the transistor was measured. FIGS. 8A and 8B show the results. All data is reported on packaged devices with 16 mm total gate periphery measured at Vds=28 V and 2.14 GHz.

FIG. 8A shows a single-tone power-sweep reaching 30 W of saturated output power, 10 dB gain and 43% peak drain efficiency.

FIG. 8B shows efficiency and ACPR as a function of output power. The power at −39 dBc is 4.5 W (280 mW/mm) with a corresponding drain efficiency of 22.5%.

The results establish that transistors of the invention can operate at low ACPR values, as well as high efficiencies and power densities.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A device adapted to receive an input signal and to transmit an output signal, the device comprising:
   at least one transistor structure to receive the input signal, the at least one transistor including at least one active region formed in a gallium nitride material region, the at least one transistor structure being adapted to amplify the input signal to form the output signal, wherein the output signal, when transmitted, has an adjacent channel power ratio (ACPR) of less than or equal to −20 dBc at a device efficiency of greater than or equal to 20%.

2. The device of claim 1, wherein the output signal has an ACPR of between −25 dBc and −45 dBc.

3. The device of claim 1, wherein the output signal has an ACPR of less than or equal to −32 dBc at a device efficiency of greater than or equal to 20%.

4. The device of claim 1, wherein the output signal has an ACPR of less than or equal to −39 dBc at a device efficiency of greater than or equal to 20%.

5. The device of claim 1, wherein the output signal has an ACPR of less than or equal to −39 dBc at a device efficiency of between 20% and 40%.

6. The device of claim 1, wherein the at least one transistor structure includes a source electrode, a gate electrode and a drain electrode associated with the at least one active region.

7. The device of claim 6, wherein the output signal has an ACPR of less than or equal to −20 dBc at a device efficiency of greater than or equal to 20%, and the device has a power density of between 0.1 W/mm and 10 W/mm.

8. The device of claim 1, wherein the device has a power density of between 0.1 W/mm and 10 W/mm.

9. The device of claim 6, wherein the gate electrode receives the input signal and the amplified signal is provided at the drain electrode.

10. The device of claim 1, further comprising at least one matching component adapted to transform an impedance of the device.

11. The device of claim 10, wherein the at least one matching component includes an input matching circuit adapted to transform an input impedance of the device.

12. The device of claim 10, wherein the at least one matching component includes an output matching circuit adapted to transform an output impedance of the device.

13. The device of claim 1, wherein the ACPR varies by less than 10% over a range of 5 dB of output power.

14. The device of claim 1, wherein the ACPR varies by less than 10% over a range of 5% efficiency.

15. The device of claim 1, wherein the ACPR varies by less than 10% over a range of 10% efficiency.

16. The device of claim 1, wherein the input signal is a W-CDMA modulated signal and the output signal is transmitted in accordance with the W-CDMA standard.

17. The device of claim 16, wherein the W-CDMA modulated input signal is provided directly to the at least one transistor without undergoing signal processing to compensate for distortion caused by amplifying the input signal.

18. The device of claim 1, wherein the at least one transistor structure comprises a plurality of transistor structures.

19. The device of claim 1, wherein the at least one transistor structure comprises a silicon substrate, wherein the gallium nitride material region is formed on the silicon substrate.

20. The device of claim 19, further comprising a transition layer formed between the silicon substrate and the gallium nitride material region.

21. The device of claim 20, wherein the transition layer is compositionally-graded.

22. The device of claim 1, wherein the output signal includes a single carrier signal.

23. The device of claim 1, wherein the output signal includes a plurality of carrier signals.

24. The device of claim 1, wherein the input signal is a radio frequency (RF) signal and the at least one transistor operates as a class AB amplifier.

25. The device of claim 1, wherein the input signal is a radio frequency (RF) signal, and wherein current flows through the at least one transistor for between 51% and 99% of each RF cycle of the input signal.

26. The device of claim 25, wherein current flows through the at least one transistor for between 51% and 75% of each RF cycle of the input signal.

27. The device of claim 25, wherein current flows through the at least one transistor for between 51% and 60% of each RF cycle of the input signal.

28. The device of claim 25, wherein current flows through the at least one transistor for substantially 55% of each RF cycle of the input signal.

29. A method of generating an output signal for wireless transmission, the method comprising:
receiving an input signal comprising information to be transmitted;
amplifying the input signal via at least one transistor structure having at least one active region formed in a gallium nitride material region to provide the output signal; and
transmitting the output signal such that the output signal has an ACPR of less than or equal to −20 dBc at a device efficiency of greater than or equal to 20%.

30. The method of claim 29, wherein the act of transmitting includes an act of transmitting the output signal such that the output signal has an ACPR of between −20 dBc and −45 dBc.

31. The method of claim 29, wherein the act of transmitting includes an act of transmitting the output signal such that the output signal has an ACPR of less than or equal to −32 dBc at a device efficiency of greater than or equal to 20%.

32. The method of claim 29, wherein the act of transmitting includes an act of transmitting the output signal such that the output signal has an ACPR of less than or equal to −39 dBc at a device efficiency of greater than or equal to 20%.

33. The method of claim 29, wherein the act of transmitting includes an act of transmitting the output signal such that the output signal has an ACPR of less than or equal to −39 dBc at a device efficiency of between 20% and 40%.

34. The method of claim 29, wherein the act of transmitting includes an act of transmitting the output signal such that the output signal has an ACPR which varies by less than 10% over a range of 5 dB of output power.

35. The method of claim 29, wherein the act of transmitting includes an act of transmitting the output signal such that the output signal has an ACPR which varies by less than 10% over a range of 5% efficiency.

36. The method of claim 29, wherein the act of transmitting includes an act of transmitting the output signal such that the output signal has an ACPR which varies by less than 10% over a range of 10% efficiency.

37. The method of claim 29, wherein the input signal is a W-CDMA modulated signal and the act of transmitting includes an act of transmitting the output signal in accordance with the W-CDMA standard.

38. The method of claim 29, wherein amplifying the input signal includes operating the at least one transistor as a class AB amplifier.

39. The method of claim 29, wherein the input signal is a radio frequency (RF) signal and wherein amplifying the input signal includes operating the at least one transistor such that current flows in the at least one transistor for between 51% and 99% of each RF cycle of the input signal.

40. The method of claim 39, wherein amplifying the input signal includes operating the at least one transistor such that current flows in the at least one transistor for between 51% and 75% of each RF cycle of the input signal.

41. The method of claim 39, wherein amplifying the input signal includes operating the at least one transistor such that current flows in the at least one transistor for between 51% and 60% of each RF cycle of the input signal.

42. The method of claim 39, wherein amplifying the input signal includes operating the at least one transistor such that current flows in the at least one transistor for substantially 55% of each RF cycle of the input signal.

43. The method of claim 29, further comprising an act of transforming at least one of an input impedance and an output impedance via at least one matching network.

44. A device for generating a radio frequency (RF) output signal from an RF input signal, the device comprising:
at least one transistor having at least one active region formed in a gallium nitride material layer, the at least one transistor arranged to receive the RF input signal and, when present, amplify the RF input signal to provide the RF output signal; and
at least one matching circuit adapted to transform at least one impedance of the device such that, when the device is loaded with a load, the RE output signal is capable of being transmitted with an ACPR of less than or equal to −20 dBc at a device efficiency of greater than or equal to 20%.

45. The device of claim 44, wherein the at least one matching circuit includes an output matching circuit adapted to transform an output impedance of the device.

46. The device of claim 44, wherein the at least one matching circuit includes an input matching circuit adapted to transform an input impedance of the device.

47. The device of claim 44, wherein the at least one matching circuit includes an output matching circuit to transform an output impedance of the device and an input matching circuit adapted to transform an input impedance of the device.

48. The device of claim 44, wherein the RE output signal is capable of being transmitted with an ACPR of between −25 dBc and −45 dBc.

49. The device of claim 44, wherein the RE output signal is capable of being transmitted with an ACPR of less than or equal to −20 dBc at a device efficiency of greater than or equal to 20%.

50. The device of claim 44, wherein the RE output signal is capable of being transmitted with an ACPR of less than or equal to −32 dBc at a device efficiency of greater than or equal to 20%.

51. The device of claim 44, wherein the RF output signal is capable of being transmitted with an ACPR of less than or equal to −39 dBc at a device efficiency of greater than or equal to 20%.

52. The device of claim 44, wherein the RF output signal is capable of being transmitted with an ACPR of less than or equal to −39 dBc at a device efficiency of between 20% and 40%.

53. The device of claim 44, wherein the at least one transistor structure includes a source electrode, a gate electrode and a drain electrode associated with the at least one active region.

54. The device of claim 53, wherein the output signal has an ACPR of less than or equal to −20 dBc at a device efficiency of greater than or equal to 20%, and the device has a power density of between 0.1 W/mm and 10 W/mm.

55. The device of claim 44, wherein the device has a power density of between 0.1 W/mm and 10 W/mm.

56. The device of claim 53, wherein the gate electrode receives the RF input signal and the RF amplified signal is provided at the drain electrode.

57. The device of claim 44, wherein the ACPR varies by less than 10% over a range of 5 dB of output power.

58. The device of claim 44, wherein the RF output signal is capable of being transmitted such that the RF output signal has an ACPR which varies by less than 10% over a range of 5% efficiency.

59. The device of claim 44, wherein the RF output signal is capable of being transmitted such that the RF output signal has an ACPR which varies by less than 10% over a range of 10% efficiency.

60. The device of claim 44, wherein the RF input signal is W-CDMA modulated and RF output signal is capable of being transmitted in accordance with the W-CDMA standard.

61. The device of claim 60, wherein the W-CDMA modulated input signal is provided directly to the at least one transistor without undergoing signal processing to compensate for distortion caused by amplifying the input signal.

62. The device of claim 44, wherein the at least one transistor structure comprises a plurality of transistor structures.

63. The device of claim 44, wherein the at least one transistor structure comprises a silicon substrate, wherein the gallium nitride material region is formed on the silicon substrate.

64. The device of claim 63, further comprising a transition layer formed between the silicon substrate and the gallium nitride material region.

65. The device of claim 64, wherein the transition layer is compositionally-graded.

66. The device of claim 44, wherein the output signal includes a single carrier signal.

67. The device of claim 44, wherein the output signal includes a plurality of carrier signals.

68. The device of claim 44, wherein the at least one transistor operates as a class AB amplifier.

69. The device of claim 44, wherein current flows through the at least one transistor for between 51% and 99% of each RF cycle of the input signal.

70. The device of claim 69, wherein current flows through the at least one transistor for between 51% and 75% of each RF cycle of the input signal.

71. The device of claim 69, wherein current flows through the at least one transistor for between 51% and 60% of each RF cycle of the input signal.

72. The device of claim 69, wherein current flows through the at least one transistor for substantially 55% of each RF cycle of the input signal.

73. The device of claim 1, wherein the output signal has an ACPR of less than or equal to −20 dBc at a device efficiency of greater than or equal to 30%.

74. The device of claim 1, wherein the output signal has an ACPR of less than or equal to −20 dBc at a device efficiency of between 20% and 45%.

75. The method of claim 29, wherein the act of transmitting includes an act of transmitting the output signal such that the output signal has an ACPR of less than or equal to −20 dBc at a device efficiency of greater than or equal to 30%.

76. The method of claim 29, wherein the act of transmitting includes an act of transmitting the output signal such that the output signal has an ACPR of less than or equal to −20 dBc at a device efficiency of between 20% and 45%.

77. The device of claim 44, wherein the RF output signal is capable of being transmitted with an ACPR of less than or equal to −20 dBc at a device efficiency of greater than or equal to 30%.

78. The device of claim 44, wherein the RF output signal is capable of being transmitted with an ACPR of less than or equal to −20 dBc at a device efficiency of between 20% and 45%.

79. A device adapted to receive an input signal and to transmit an output signal, the device comprising:
at least one transistor structure to receive the input signal, the at least one transistor including at least one active region formed in a gallium nitride material region, the at least one transistor structure being adapted to amplify the input signal to form the output signal,
wherein the output signal, when transmitted, has an adjacent channel power ratio (ACPR) of less than or equal to −20 dBc, and
wherein the ACPR varies by less than 10% over a range of 5 dB of output power.

80. A device adapted to receive an input signal and to transmit an output signal, the device comprising:
at least one transistor structure to receive the input signal, the at least one transistor including at least one active region formed in a gallium nitride material region, the at least one transistor structure being adapted to amplify the input signal to form the output signal,
wherein the output signal, when transmitted, has an adjacent channel power ratio (ACPR) of less than or equal to −20 dBc, and
wherein the ACPR varies by less than 10% over a range of 5% efficiency.

81. A device adapted to receive an input signal and to transmit an output signal, the device comprising:
at least one transistor structure to receive the input signal, the at least one transistor including at least one active region formed in a gallium nitride material region, the at least one transistor structure being adapted to amplify the input signal to form the output signal,
wherein the output signal, when transmitted, has an adjacent channel power ratio (ACPR) of less than or equal to −20 dBc, and
wherein the input signal is a W-CDMA modulated signal and the output signal is transmitted in accordance with the W-CDMA standard and the W-CDMA modulated input signal is provided directly to the at least one transistor without undergoing signal processing to compensate for distortion caused by amplifying the input signal.

* * * * *

UNITED STATES PATENT AND TRADEMARK OFFICE
CERTIFICATE OF CORRECTION

PATENT NO. : 7,135,720 B2  
APPLICATION NO. : 10/913297  
DATED : November 14, 2006  
INVENTOR(S) : Walter H. Nagy et al.

Page 1 of 1

It is certified that error appears in the above-identified patent and that said Letters Patent is hereby corrected as shown below:

Col. 18, Line 38  
Claim 44, line 38, please replace "RE" with --RF--;

Col. 18, Line 53  
Claim 48, line 53, please replace "RE" with --RF--;

Col. 18, Line 56  
Claim 49, line 56, please replace "RE" with --RF--; and

Col. 18, Line 60  
Claim 50, line 60, please replace "RE" with --RF--.

Signed and Sealed this

Thirtieth Day of January, 2007

JON W. DUDAS  
*Director of the United States Patent and Trademark Office*